United States Patent
Bell et al.

[19]

[11] Patent Number: 6,011,440
[45] Date of Patent: Jan. 4, 2000

[54] AMPLIFIER HAVING OUTPUT RANGE THAT EXCEEDS SUPPLY VOLTAGE

[75] Inventors: David B. Bell, Los Altos; Dale R. Eager, Hollister, both of Calif.

[73] Assignee: Linear Technology Corporation, Milpitas, Calif.

[21] Appl. No.: 08/819,966

[22] Filed: Mar. 18, 1997

[51] Int. Cl.$^7$ .................................................. H03F 3/04
[52] U.S. Cl. ............................................ 330/297; 330/202
[58] Field of Search .................................... 330/110, 149, 330/202, 261, 282, 297; 331/25, 36 C, 177 V

[56] References Cited

U.S. PATENT DOCUMENTS

| | | | |
|---|---|---|---|
| 3,701,036 | 10/1972 | Stefenel | 330/110 X |
| 4,468,638 | 8/1984 | Kyriakos | 331/178 |
| 4,564,815 | 1/1986 | Naito | 331/36 C X |
| 5,212,456 | 5/1993 | Kovalcik et al. | 330/261 |
| 5,289,137 | 2/1994 | Nodar et al. | 330/297 X |
| 5,412,309 | 5/1995 | Ueunten | 330/257 X |
| 5,422,600 | 6/1995 | Petty et al. | 330/261 X |
| 5,631,606 | 5/1997 | Tran | 330/255 X |
| 5,834,977 | 11/1998 | Maehara et al. | 330/297 |

OTHER PUBLICATIONS

"Rail to Rail Input; Rail–to–Rail Output; Zero–Drift OP Amp," LTC 1152, Data Sheet published by Linear Technology Corporation, Jan. 1995, pp. 1–8.

Barker, Cythia L., "Introduction to Single Chip Microwave PLLs," Application Note 885, National Semiconductor Corporation, Mar. 1993, pp. 1–5.

Keese, William O., "An Analysis and Performance Evaluation of a Passive Filter Design Technique for Charge Pump Phase–Locked Loops," Application Note 1001, National Semiconductor Corporation, Sep. 1995, pp. 1–7.

"MC145192 and MCI45202, Evaluation Board Manual," Semiconductor Technical Data, Motorola, Inc., 1996, pp. 39–41.

"PLL–Frequency Synthesizer, PMP 2306T", Siemens Semiconductor Group, 1993, pp. 1–27.

*Primary Examiner*—Steven J. Mottola
*Attorney, Agent, or Firm*—Fish & Neave; Michael J. DeHaemer, Jr.

[57] ABSTRACT

Amplifier circuitry is provided having an output voltage range that exceeds its supply rail voltage. Such an amplifier may be useful in battery powered applications calling for driving a high impedance load with a low current, moderate bandwidth signal The amplifier circuitry includes a transconductance amplifier, for providing a high output impedance, and a charge pump DC/DC converter, for providing a high supply voltage to the transconductance amplifier. In one embodiment of the invention, the gain of the amplifier is a function of the input voltage so as to linearize a transfer function between the amplifier input and a response of a load at the amplifier's output.

42 Claims, 4 Drawing Sheets

6,011,440

AMPLIFIER HAVING OUTPUT RANGE THAT EXCEEDS SUPPLY VOLTAGE

FIELD OF THE INVENTION

The present invention relates to amplifier circuitry for low voltage devices such as battery powered products. More specifically, the present invention relates to low voltage amplifier circuitry having an output voltage range that exceeds its supply voltage.

BACKGROUND OF THE INVENTION

In many areas of the electronics industry, designers are turning toward lower operating voltages. Lower voltages lead to increased battery life, reduced product weight, and enable integrated circuits to be smaller and more dense. This is particularly advantageous to designers of portable electronic devices. For example, in the early 1990's, most cellular telephones were designed using 5 volt circuitry.

However, the current trend is toward using circuitry having operating voltages in the range of 2.5 to 3.0 volts, and even lower voltages may be used in the future.

While reduced operating voltages are beneficial in extending useful battery life, the lower voltages may adversely circuit operation. For example, as circuit supply voltages are reduced, the range of circuit signal voltages are also reduced, thereby increasing the effects of noise. Furthermore, typical amplifier circuitry cannot output a voltage that covers the full range of the supply voltage. Rather, the output voltage is often limited to values no closer that a few tenths of a volt to the supply rails. This minimum voltage differential between a supply rail and the output voltage, referred to herein as "headroom," is a function of circuit design and varies little with changes in supply voltage. Thus, as supply voltages are reduced, headroom occupies a larger fraction of the available output voltage range.

One particular application in which lower operating voltages adversely impact circuit operation is in phase-locked loop (PLL) circuitry. PLLs are used in a wide range of applications, primarily involving forms of communication. For example, phase-locked loops are used to recover the carrier frequency from a radio transmission, to recover a data clock from a digital bit stream, and to track the frequency of a signal. Phase-locked loops are also used to modulate and demodulate the frequency or phase of a signal, to synthesize accurate frequencies for radio transmission and reception, and many other applications.

In its most basic form, a PLL includes a phase detector and a voltage controlled oscillator (VCO). The phase detector produces an error signal, or control voltage, based on a phase difference between the VCO output signal and a reference frequency. The control voltage in turn determines the frequency of the VCO. Thus, the phase detector provides feedback so that the VCO oscillates at the reference frequency. Additional details of the operation of a phase-locked loop are discussed hereinbelow. A more thorough treatment may be found in *Phase-Locked Loop Circuit Design*, Dan H. Wolaver, Prentice Hall, 1991, which is incorporated in its entirety herein by this reference.

Reduced circuit operating voltages adversely impact PLL operation in a number of ways. First, reduced supply voltages reduce the available range of the control voltage supplied to the VCO, thereby limiting the available frequency range of the PLL. This limitation is made more severe because of the headroom characteristics of typical phase detector circuitry, which further reduce the available control voltage range.

Although not caused by reduced operating voltages, PLL circuits generally exhibit a non-linear relationship between control voltage and output frequency. This makes PLL feedback loop compensation more difficult since loop gain changes with VCO operating point. Generally, feedback loop compensation is determined at the VCO operating point having the highest loop gain, causing the PLL to be over-compensated through much of its operating range. Such over-compensation may adversely impact applications in which the PLL circuitry must be able to rapidly switch frequencies. For example, in the time division multiplexing scheme specified for GSM cellular telephones, the PLL circuitry must be able to change frequencies in one time slot, or about 570 microseconds. Over-compensated PLL circuitry may have difficulty settling at the new operating frequency in the required time.

It would therefore be desirable to provide circuits and methods for amplifiers having an operating voltage of less than about 5 volts, and preferably in the range of less than about 3 volts.

It would also be desirable to provide circuits and methods for providing low voltage amplifiers without sacrificing output voltage range.

In addition, it would be desirable to provide circuits and methods for phase-locked loops having an operating voltage of less than about 5 volts, and preferably in the range of less than about 3 volts.

It would also be desirable to provide circuits and methods for providing low voltage phase-locked loops without sacrificing frequency range.

Furthermore, it would be desirable to provide circuits and methods for providing a phase-locked loop having a nearly-linear control voltage-to-frequency transfer function over the PLL's entire frequency range.

SUMMARY OF THE INVENTION

These and other objects of the invention are provided by integrated amplifier circuitry including a charge pump DC/DC converter for increasing the available operating voltage, and transconductance amplifier circuitry for driving a high impedance load. In one embodiment of the invention, the amplifier has an input dependent gain such that the transfer characteristic is a piece-wise linear approximation of a non-linear transfer function.

BRIEF DESCRIPTION OF THE DRAWINGS

The above and other objects and advantages of the present invention will be apparent upon consideration of the following detailed description taken in conjunction with the accompanying drawings, in which like characters refer to like parts throughout, and in which.

DETAILED DESCRIPTION

To aid in disclosing a preferred embodiment of the present invention, the following description is written in terms of PLL circuitry, and more specifically, in terms of an amplifier for driving a varactor diode within a VCO. However, the present invention is not limited to such an application, and is more generally useful whenever low voltage circuitry must drive a high impedance load with voltages that exceed the supply rail. For example, to fully turn on a high-side, N-channel, MOSFET power switch, it is necessary to raise its gate voltage several volts above its source voltage. An amplifier designed in accordance with principles of the present invention may provide the necessary output voltage to fully enhance the MOSFET. A similar amplifier may be used to bias a varactor diode in a PLL.

Figure 1:
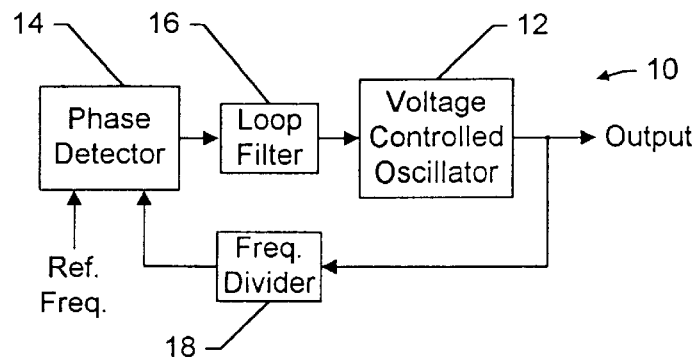
FIG. 1 is a schematic block diagram of an exemplary prior art PLL.

In FIG. 1, phase-locked loop (PLL) circuitry 10 is shown including voltage controlled oscillator 12, which outputs a signal at a frequency determined by a control voltage at its input. Voltage controlled oscillator (VCO) 12 has an output signal frequency matched to that of the input signal by means of a feedback path including phase detector 14 and loop filter 16. Phase detector 14 provides a phase error signal proportional to a difference between the phase of the reference frequency and the phase of the VCO output signal. Loop filter 16 filters the phase error signal to produce the control voltage supplied to VCO 12. Filter 16 may also be used to control the bandwidth of the PLL and to optimize PLL response time.

As an illustrative example of the operation of PLL 10, consider a situation in which the phase of the VCO output signal lags the reference frequency by a small amount. In this event, phase detector 14 generates an error signal tending to increase the control voltage. The increased control voltage causes the frequency of VCO 12 to rise to a frequency slightly greater than the reference frequency. The frequency mismatch gradually reduces the phase error and may eventually cause the VCO input signal to lead the reference signal by a small amount. Phase detector 14 then drives the control voltage lower, thereby reducing the VCO frequency and hence the phase error between the VCO output signal and the reference frequency. The response time and overshoot of this frequency correction can be tailored by selecting suitable characteristics of loop filter 16. The feedback provided by the phase detector causes the VCO to oscillate at a frequency very near that of the input signal.

Additional components may be added to a basic PLL to improve various characteristics of the PLL or to cause the output frequency to be a multiple of the input reference frequency. For example, PLL 10 may include frequency divider 18 so that the VCO output frequency is a multiple of the reference frequency. Additional circuits to filter, square, multiply, and otherwise manipulate the input, output, and/or feedback signals may be provided to modify PLL behavior in certain applications. These and other design considerations are more fully described in the previously incorporated Wolaver reference.

VCOs are often based on resonant circuits because of their increased stability, noise immunity, and higher operating frequencies. A varactor diode is a device having a capacitance that may be varied electronically. Specifically, a varactor diode is a diode designed such that its junction capacitance is a strong function of a reverse bias voltage across the diode. Thus, varactor diodes are often used to control the output frequency of a resonant oscillator based VCO.

Figure 2:
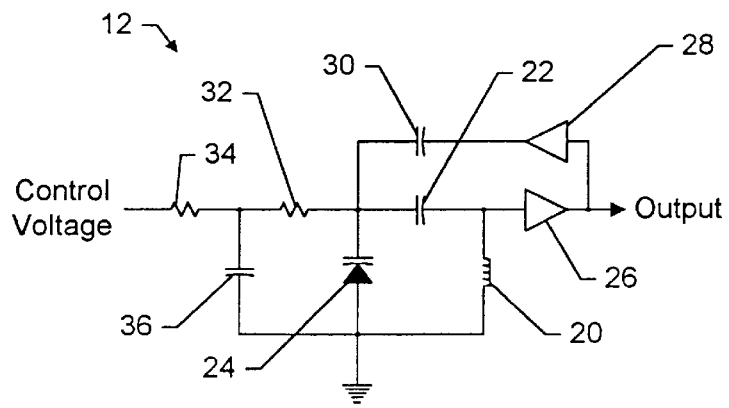
FIG. 2 is a simplified schematic diagram of the VCO of FIG. 1.

Exemplary varactor based VCO 12 is shown in FIG. 2. VCO 12 includes a resonant LC circuit, also known as an LC tank, formed by inductor 20, capacitor 30, capacitor 22, and varactor 24. Output amplifier 26 buffers the output of the LC tank to prevent it from being loaded down by downstream circuitry. Feedback amplifier 28 and capacitor 30 provide a feedback path for driving and sustaining resonant oscillation of the LC tank. The resonant frequency of the oscillator, and hence of VCO 12, is a function of the values of inductor 20, capacitor 22, capacitor 30, and varactor 24 according to the well known formula:

$$f = \frac{1}{2\pi\sqrt{LC}} \qquad (1)$$

Where 'C' is the equivalent combined capacitance of capacitor 22, capacitor 30, and varactor 24.

As noted above, the capacitance of a varactor can be varied by altering the reverse bias applied to the varactor. Since the bias applied to varactor 24 is determined by the control voltage, the control voltage determines the capacitance of varactor 24, and hence the LC tank resonant frequency. Resistors 32 and 34, and capacitor 36 form a low-pass filter for smoothing the voltage used to bias varactor 24 and also isolate the AC oscillation signal present on varactor 24 from the DC control voltage.

Varactor diode capacitance is generally a non-linear function of the reverse bias voltage. Furthermore, total tank capacitance is a non-linear function of varactor capacitance, and tank circuit resonant frequency (i.e., VCO frequency) is a non-linear function of tank capacitance. Thus, VCO frequency does not vary linearly with control voltage. An exemplary control voltage-to-frequency transfer function is shown in FIG. 3.

Figure 3:
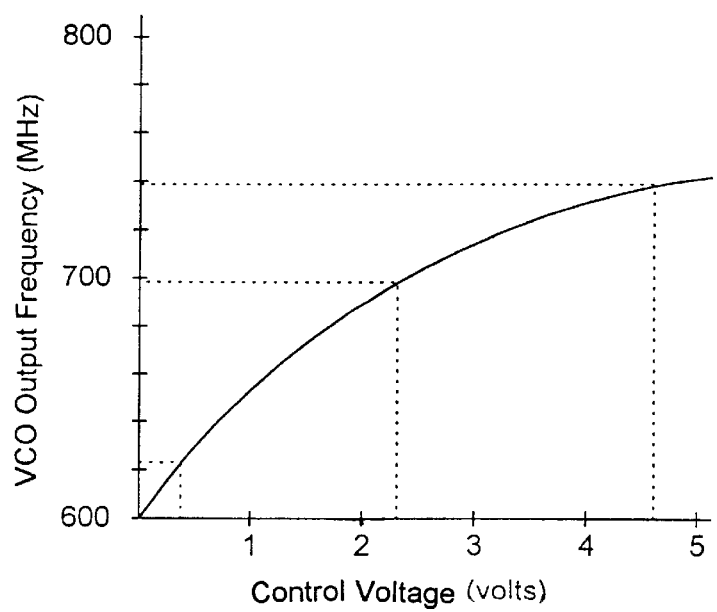
FIG. 3. is an exemplary graph of control voltage-to-frequency for the VCO of FIG. 2.

In addition to illustrating the non-linear nature of a typical VCO transfer function, FIG. 3 also shows the effects of reduced control voltage range on VCO frequency range. For example, if the control voltage may range from approximately 0.4 volts to 4.6 volts (a typical output voltage range for a 5 volt phase detector), then the frequency range may be from approximately 620 MHz to 740 MHz. However, if the control voltage is limited to a range of approximately 0.4 volts to 2.3 volts (a typical output voltage range for a 2.7 volt phase detector), then the VCO frequency range is reduced to approximately 620 MHz to 700 MHz.

Figure 4A:
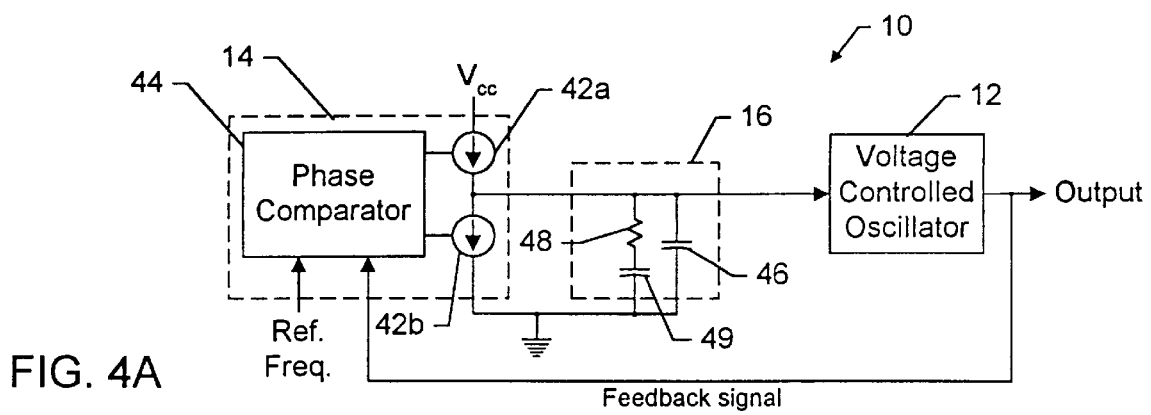
FIG. 4A and 4B are, respectively, a more detailed schematic diagram of the phase detector and loop filter of FIG. 1, and a timing diagram showing the operation of the circuit of FIG. 4A.
Figure 4B:
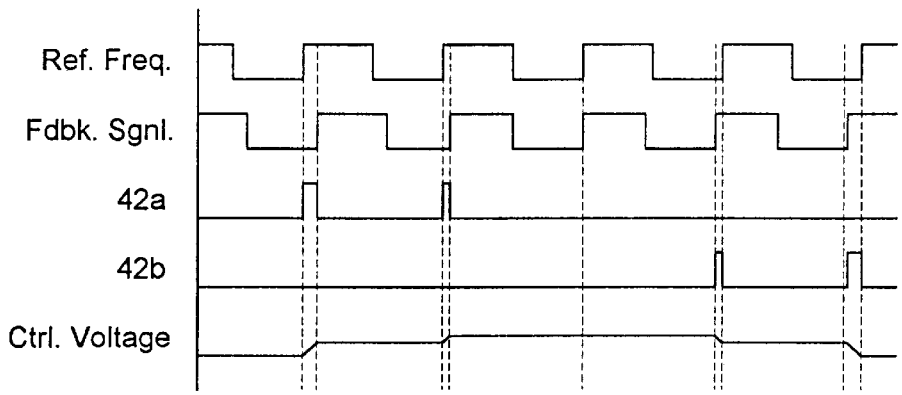

The difference between the control voltage range (e.g., 0.4–4.6 volts) and the circuit operating voltage (e.g., 0–5 volts) is referred to as headroom, and is a characteristic of the phase detector output circuitry. Typical output circuitry of phase detector 14 is shown in FIG. 4A. The output stage comprises current sources 42a and 42b, which are turned on and off by phase comparator 44 based on the phase relationship between the signals on its inputs. For example, current source 42a may be turned on and current source 42b turned off from a rising edge of the reference signal to a rising edge of the feedback signal, whereas switch 42a may be turned off and current source 42b turned on from a rising edge of the feedback signal to a rising edge of the reference signal. This is illustrated by the timing diagram of FIG. 4B.

When current source 42a is turned on current flows from the supply rail (Vcc) to charge filter capacitors 46 and 49.

Figure 5:
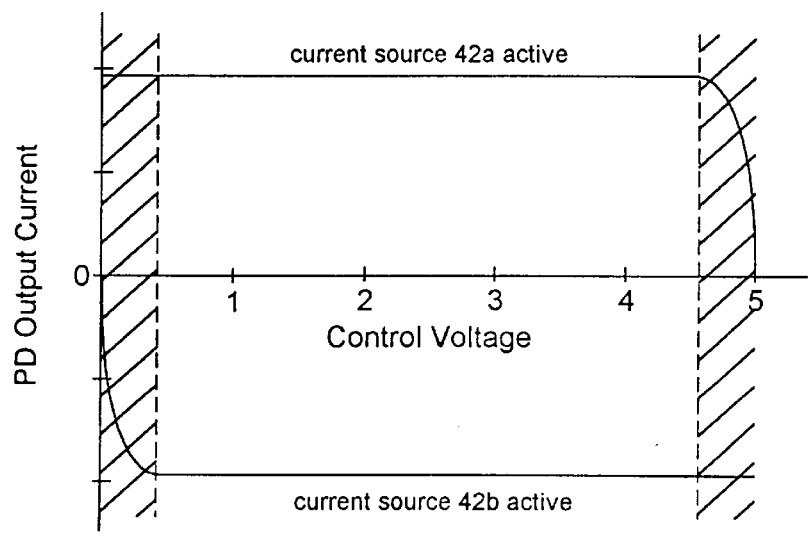
FIG. 5 is an exemplary graph of phase detector headroom.

This raises the control voltage at the input of VCO 12. In an analogous manner, current source 42b provides a path for current to flow from filter capacitors 46 and 49 to ground. As the control voltage rises, the voltage difference between the supply rail and filter capacitor 46 is reduced. When the voltage differential becomes sufficiently small, the current flow also begins to decrease and may even cease altogether. Similar behavior occurs when the control voltage is very low. Thus, the control voltage is limited to a range somewhat less than the voltage difference between the power supply rails, as illustrated in FIG. 5, wherein headroom for a typical five volt phase detector is indicated by cross hatching.

Figure 6:
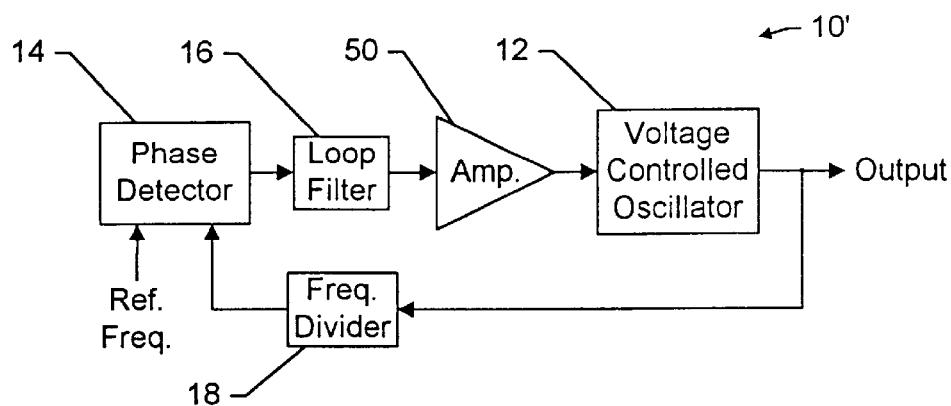
FIG. 6 is a schematic block diagram of an exemplary PLL in accordance with principles of the present invention.

The net effect of phase detector headroom and reduced operating voltages is to limit VCO frequency range. In accordance with the principles of the present invention, these limitations may be overcome by including an amplifier (i.e., a varactor driver) having an output voltage range that is greater than its supply voltage, between the loop filter and the VCO input, as shown in FIG. 6. In accordance with the principles of the present invention, varactor driver 50 takes the control voltage as its input and provides an amplified output suitable for biasing a varactor diode in VCO 12.

Figure 7:
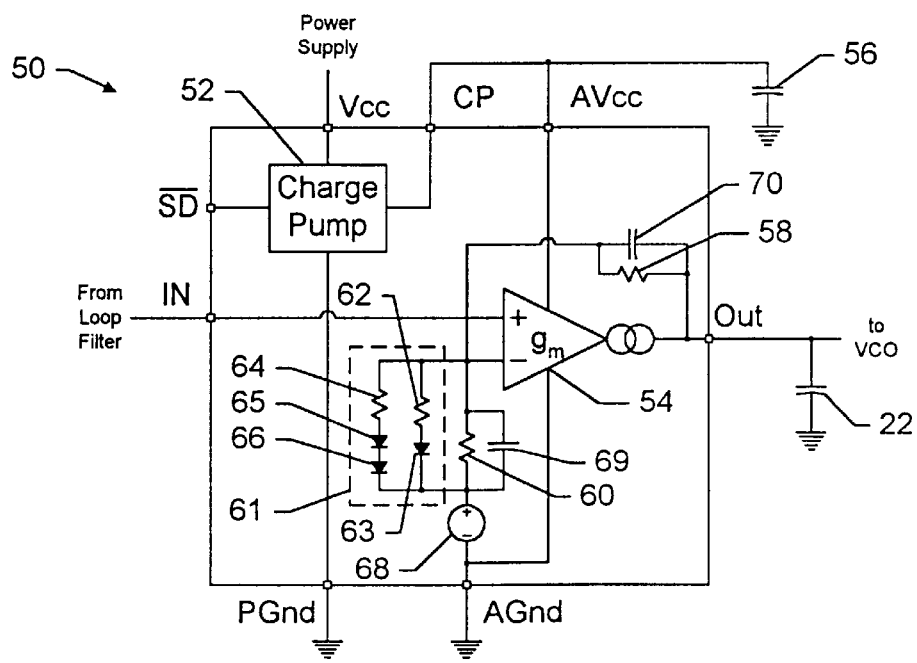
FIG. 7 is a simplified schematic diagram of exemplary amplifier circuitry used to drive the VCO of FIG. 6.

Referring now to FIG. 7, exemplary varactor driver circuitry 50, including charge pump DC/DC converter 52 and amplifier 54, is described. Preferably, charge pump DC/DC converter 52 is a multi-phase, switched-capacitor, voltage doubler having an effective switching frequency of about 4 MHz. Charge pump DC/DC converter 52 generates a voltage approximately double Vcc on its CP output to provide power for amplifier 54.

Figure 8:
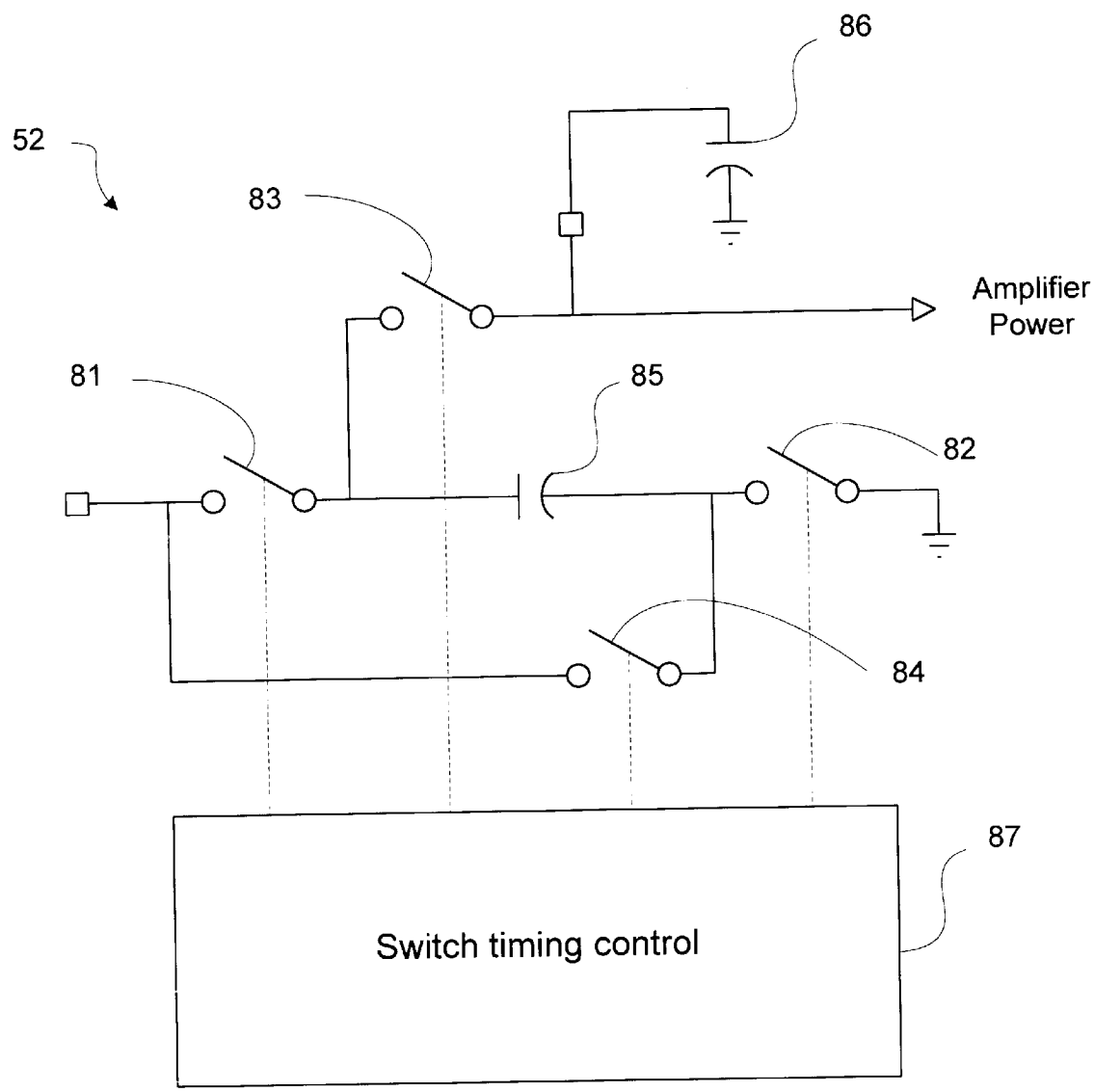
FIG. 8 is a simplified schematic diagram of the switched capacitor charge pump of FIG. 7.

A simplified schematic of a typical switched capacitor charge pump voltage doubler is shown in FIG. 8, wherein charge pump 52 includes flying capacitor 85, storage capacitor 56, and switches 81–84. Switches 81–84 are operated in two phases by switch timing control 87 to transfer charge from the supply voltage (Vcc) to storage capacitor 56.

During the first phase, switches 81–82 are shut, while switches 83–84 are open, so that flying capacitor 85 is charged to the supply voltage (Vcc). In the second phase, switches 81–82 are open and switches 83–84 are shut and the charge on flying capacitor 85 is transferred to storage capacitor 56. In the second phase, switches 81–84 configure the circuit so that the voltage on flying capacitor 85 is added to the supply voltage and, therefore, the voltage on storage capacitor 56 is approximately double the supply voltage.

In a first embodiment of the present invention, only output stage circuitry of amplifier 54 (of FIG. 7) is supplied from DC/DC converter 52. However, in a preferred embodiment, additional circuitry of amplifier 54, such as input stage circuitry, is supplied from charge pump DC/DC converter 52 enabling the input to amplifier 54 to exceed the supply rail voltage. Thus, amplifier 54 may be classified as a "rail-to-rail" input amplifier.

In accordance with a preferred embodiment of the invention, charge pump 52 resides in the same integrated circuit package as amplifier 54, and storage capacitor 56 is the only external component of charge pump 52. In an alternative embodiment, phase detector 14 (of FIG. 6) and varactor driver circuitry 50 are combined into a single integrated device.

Various DC/DC converters, for example a voltage tripler, operating at various operating frequencies may be used to provide power to amplifier 54. However, at frequencies greater than about 4 MHz it becomes practical to use internal switching capacitors in an integrated circuit embodiment of a varactor driver according to the principles of the present invention. Furthermore, the high output impedance of transconductance amplifier 54, in conjunction with output filter capacitor 22, provides excellent high frequency power supply ripple rejection. The value of output filter capacitor 22 may be tailored to tune the 3 dB bandwidth of the varactor driver circuitry.

Amplifier 54 converts the control voltage at its input to a current for charging or discharging capacitor 22. Amplifier 54 comprises a transconductance amplifier having a closed-loop voltage gain set by the values of resistor 58 and 60. Preferably, the value of resistors 58 and 60 are selected to give a gain of about 1.7–2.5, so that an input of about 2–3 volts will charge varactor 24 to a reverse bias of about 5 volts. In some applications, amplifier 50 may also include voltage source 68 to introduce an input voltage offset, so that a 0 volt output may be provided even when the input signal is limited to a lower value greater than 0 volts, e.g., due to phase detector output stage headroom. Capacitors 69 and 70 provide frequency compensation and reduce thermal noise generated by high resistance feedback resistors 58 and 60.

Referring back to FIG. 2, the output of amplifier 54 is applied to varactor 24 through a low-pass filter including resistors 32 and 34, and capacitor 36. Other components coupled to varactor 24 include capacitors 22 and 30. Since these components are essentially open circuits to DC signals, (e.g., the varactor bias voltage), amplifier 54 only needs to supply enough current to charge varactor 24, and other associated capacitors, up to the desired reverse bias voltage. Thus, the current demands placed on transconductance amplifier 54 by VCO circuitry 12 are very low, and may be satisfied by charge pump DC/DC converter 52. Although higher currents may be used, in a preferred embodiment of the present invention, transconductance amplifier 54 draws a current of less than about 100–200 microamperes so that charge pump DC/DC converter 52 may use internal switching capacitors.

As discussed herein previously, VCO output frequency is generally a non-linear function of control voltage. This non-linearity makes the design of optimized loop filters more difficult, complicating PLL design. In accordance with the present invention, varactor driver 50 may optionally have a non-linear transfer function such that VCO frequency is an approximately linear function of the control voltage seen at the phase detector output. This is accomplished by varying the gain of amplifier 54, based on the control voltage, in a piece-wise linear fashion, to linearize the control voltage-to-frequency transfer function, as seen by the loop filter.

Referring again to FIG. 7, series connected resistor 62 and diode 63 are coupled in parallel with resistor 60. At low control voltages diode 63 is non-conducting and the closed-loop gain of amplifier 54 is determined by resistor 58 and 60. However, when the control voltage exceeds the forward voltage drop across diode 63, the diode starts conducting, effectively placing resistor 62 in parallel with resistor 60 and increasing the closed-loop gain of amplifier 54. Thus, inclusion of resistor 62 and series diode 63 introduces a knee, or break, in the transfer function of amplifier 54. Additional breaks may be introduced through the use of additional resistors and diodes in parallel with resistor 60. For example, a break may be introduced at a voltage equal to 2 diode drops by paralleling resistor 60 with resistor 64 in series with diodes 65 and 66. Through proper selection of the number and placement of the knees, a piece-wise linear transfer function may be obtained that corrects for the non-linear control voltage-to-VCO frequency transfer function.

One skilled in the art will thus appreciate that the present invention can be practiced by other than the described embodiments, which are presented for purposes of illustration and not of limitation, and the present invention is limited only by the claims which follow.

We claim:

1. Amplifier having a power input for accepting a power supply voltage, a signal input for accepting an input signal, and a signal output for providing an output signal, the amplifier comprising:

DC/DC converter circuitry including a switched-capacitor charge pump coupled to the power input, the DC/DC converter circuitry providing a voltage higher than the power supply voltage; and amplifier circuitry including an output stage coupled between the DC/DC converter circuitry and the signal output such that a voltage at the signal output may exceed the voltage at the power input.

2. Amplifier of claim 1 wherein the switched-capacitor charge pump comprises a voltage doubler.

3. Amplifier of claim 1 wherein the DC/DC converter circuitry and the amplifier circuitry comprise an integrated circuit.

4. Amplifier of claim 3 wherein the switched-capacitor charge pump includes on-chip charge-transfer capacitors.

5. Amplifier of claim 1 wherein the amplifier circuitry has a predetermined gain that matches a voltage range of a signal on the signal input with a predetermined voltage range of the output signal.

6. Amplifier of claim 1 wherein the amplifier circuitry has gain that is a predetermined function of the input signal.

7. Amplifier of claim 6 wherein the function is a piece-wise linear approximation of a non-linear function.

8. Amplifier of claim 7 wherein the non-linear function approximates the inverse of a transfer function of a circuit coupled to the signal output.

9. Amplifier of claim 1 wherein the amplifier circuitry comprises transconductance amplifier circuitry.

10. Amplifier of claim 9 further comprising:

a first resistor coupled between an output of the transconductance amplifier circuitry and an input of the transconductance amplifier circuitry;

a second resistor coupled to the input of the transconductance amplifier circuitry, the resistances of the first and second resistors determining a gain of the transconductance amplifier circuitry;

a third resistor coupled to the input of the transconductance amplifier circuitry; and a switch coupled in series with the third resistor such that the switch selectively places the third resistor in parallel with the second resistor responsive to a voltage on the input of the amplifier to alter a gain of the amplifier responsive to the voltage on the input of the amplifier.

11. Varactor driver circuitry having a power input for accepting a power supply voltage, a signal input for accepting an input signal, and a signal output for providing an output signal, the varactor driver circuitry comprising:

a DC/DC converter, including switched capacitor charge pump circuitry, coupled to the power input for providing a voltage higher than a voltage at the power input; and amplifier circuitry coupled to the signal input, and having an output stage coupled between the signal output and the DC/DC converter, the DC/DC converter providing power to the output stage such that a voltage of the output signal may exceed the voltage at the power input.

12. Varactor driver circuitry of claim 11 wherein the switched-capacitor charge-pump circuitry comprises a voltage doubler.

13. Varactor driver circuitry of claim 11 wherein the DC/DC converter and the amplifier circuitry comprise an integrated circuit.

14. Varactor driver circuitry of claim 13 wherein the switched-capacitor charge-pump circuitry includes on-chip charge-transfer capacitors.

15. Varactor driver circuitry of claim 11 wherein the amplifier circuitry has a predetermined gain that matches a voltage range of a signal on the signal input with a predetermined voltage range of the output signal.

16. Varactor driver circuitry of claim 11 wherein the amplifier circuitry has a gain that is a function of the input signal.

17. Varactor driver circuitry of claim 16 wherein the function is a piece-wise linear approximation of a non-linear function.

18. Varactor driver circuitry of claim 17 wherein the non-linear function approximates the inverse of a transfer function of a circuit coupled to the signal output.

19. Method of amplifying a signal comprising:

providing charge pump circuitry adapted to accept a supply voltage and for providing a voltage higher than the supply voltage; and providing amplifier circuitry adapted to accept the signal, wherein the amplifier circuitry includes an output stage coupled between the charge pump circuitry and an output of the amplifier circuitry, so that a voltage range of an amplified signal exceeds the supply voltage.

20. Method of claim 19 wherein the step of providing charge pump circuitry comprises providing a switched-capacitor charge pump voltage doubler.

21. Method of claim 20 wherein the steps of providing charge pump circuitry and amplifier circuitry comprise providing an integrated circuit.

22. Amplifier of claim 21 wherein the step of providing amplifier circuitry comprises providing amplifier circuitry having a predetermined gain that matches a voltage range of the signal with a desired voltage range of an output signal.

23. Amplifier of claim 21 wherein the step of providing amplifier circuitry comprises providing amplifier circuitry having a gain that is a predetermined function of the signal, wherein the function is a piece-wise linear approximation of a non-linear function.

24. Amplifier of claim 23 wherein the non-linear function approximates the inverse of a transfer function of a circuit coupled to a signal output.

25. Driver circuitry comprising:

an amplifier;

a DC/DC voltage converter adapted to accept an input voltage and to provide a supply voltage to the amplifier;

a first resistor coupled between an output and an input of the amplifier to create a feedback loop;

a second resistor coupled to the input of the amplifier, the resistances of the first and second resistors determining a gain of the amplifier;

a third resistor coupled to the input of the amplifier; and a first switch coupled in series with the third resistor such that the switch selectively places the third resistor in parallel with the second resistor responsive to a voltage on the input of the amplifier, thereby altering a gain of the amplifier.

26. The driver circuitry of claim 25 wherein the amplifier is a transconductance amplifier.

27. The driver circuitry of claim 25 wherein the switch is a diode.

28. The driver circuitry of claim 25 wherein the value of the second resistor and the switching point of the first switch are predetermined so that the gain of the amplifier approximates a non-linear function.

29. The driver circuitry of claim 25 wherein the driver circuitry comprises an integrated circuit.

30. The driver circuitry of claim 25 further comprising:
   a fourth resistor coupled to the input of the amplifier; and
   a second switch coupled in series with the fourth resistor such that the second switch selectively places the fourth resistor in parallel with the second and third resistors responsive to a voltage on the input of the amplifier.

31. The driver circuitry of claim 25 wherein the voltage converter is a switched capacitor voltage doubler.

32. The driver circuitry of claim 31 wherein the voltage converter and amplifier comprise an integrated circuit.

33. Circuitry for driving a high impedance load, the circuitry comprising:
   a power input for accepting power at a first voltage;
   a signal input for accepting an input signal;
   a signal output for providing an output signal;
   amplifier circuitry including an output stage coupled the signal output, wherein the amplifier circuitry has a transfer function that is a piece-wise linear approximation of a non-linear function of the input signal; and
   DC/DC converter circuitry coupled to the power input and to the output stage for providing a second voltage, higher than the first voltage, to the output stage so that a voltage at the signal output may exceed the first voltage.

34. The circuitry of claim 33 wherein the DC/DC converter circuitry and the amplifier circuitry comprise an integrated circuit.

35. The circuitry of claim 34 wherein the DC/DC converter comprises a switched-capacitor charge pump and the integrated circuit includes on-chip charge-transfer capacitors.

36. The circuitry of claim 33 wherein the non-linear function approximates the inverse of a transfer function of a circuit coupled to the signal output.

37. The circuitry of claim 33 wherein the amplifier circuitry comprises transconductance amplifier circuitry.

38. An integrated circuit comprising:
   a power input for accepting power at a first voltage;
   a signal input for accepting an input signal;
   a signal output for providing an output signal;
   amplifier circuitry including an output stage coupled the signal output for providing an output signal; and
   switched-capacitor charge pump circuitry including on-chip charge transfer capacitors, the switched-capacitor charge pump circuitry coupled to the power input and to the output stage for providing a second voltage, higher than the first voltage, to the output stage so that a voltage at the signal output may exceed the first voltage.

39. Circuitry of claim 38 wherein the non-linear function approximates the inverse of a transfer function of a circuit coupled to the signal output.

40. Circuitry of claim 38 wherein the amplifier circuitry comprises transconductance amplifier circuitry.

41. Varactor driver circuitry of claim 38 wherein the amplifier circuitry has a predetermined gain that is a piece-wise linear approximation of a non-linear function of the input signal.

42. Varactor driver circuitry of claim 41 wherein the non-linear function approximates the inverse of a transfer function of a circuit coupled to the signal output.

* * * * *